(12) United States Patent
Berlekamp

(10) Patent No.: US 8,184,437 B2
(45) Date of Patent: May 22, 2012

(54) MODULAR TEST SYSTEMS FOR SEVERE ENVIRONMENTS

(75) Inventor: John D. Berlekamp, Powell, OH (US)

(73) Assignee: Pallas Systems, LLC, Springfield, OH (US)

( * ) Notice: Subject to any disclaimer, the term of this patent is extended or adjusted under 35 U.S.C. 154(b) by 116 days.

(21) Appl. No.: 12/707,031

(22) Filed: Feb. 17, 2010

(65) Prior Publication Data

US 2010/0220441 A1   Sep. 2, 2010

Related U.S. Application Data

(60) Provisional application No. 61/153,116, filed on Feb. 17, 2009.

(51) Int. Cl.
*H05K 7/20* (2006.01)
*F28F 7/00* (2006.01)
*F16H 31/00* (2006.01)

(52) U.S. Cl. .......... 361/704; 361/679.54; 165/80.2; 257/713; 174/547; 312/236; 73/114.61

(58) Field of Classification Search .......... 361/704, 361/707–709, 714–715, 719, 679.46, 679.54; 165/80.2; 257/712–713; 174/521, 526, 547, 174/252; 312/236; 73/114.61
See application file for complete search history.

(56) References Cited

U.S. PATENT DOCUMENTS

| | | | | |
|---|---|---|---|---|
| 5,309,315 | A  * | 5/1994 | Naedel et al. | 361/704 |
| 5,916,287 | A  * | 6/1999 | Arjomand et al. | 701/29 |
| 6,246,258 | B1 | 6/2001 | Lesea | |
| 6,504,713 | B1 * | 1/2003 | Pandolfi et al. | 361/695 |
| 6,532,152 | B1 * | 3/2003 | White et al. | 361/692 |
| 6,738,454 | B2 * | 5/2004 | Mohammadian et al. | 379/21 |
| 7,817,420 | B2 * | 10/2010 | Drummy et al. | 361/695 |
| 8,050,039 | B2 * | 11/2011 | Collicutt | 361/719 |

* cited by examiner

*Primary Examiner* — Zachary M Pape
(74) *Attorney, Agent, or Firm* — Calfee, Halter & Griswold LLP

(57) ABSTRACT

A modular equipment testing apparatus is suitable for use in severe environments. The testing apparatus comprises a base computing unit, an interchangeable test instrument board, and an interchangeable equipment interface pod. The base computing unit and the interchangeable test instrument board are sealed within a computing case. A bottom panel of the computing case is formed of a heat conducting material and acts as a heat sink for removing heat from inside the computing case. The computing case and the equipment interface pod interface to form a hermetically sealed case, which can withstand a drop of 1 meter to a solid surface and immersion to a depth of 0.5 meters in water without damage to components located within the sealed case.

4 Claims, 17 Drawing Sheets

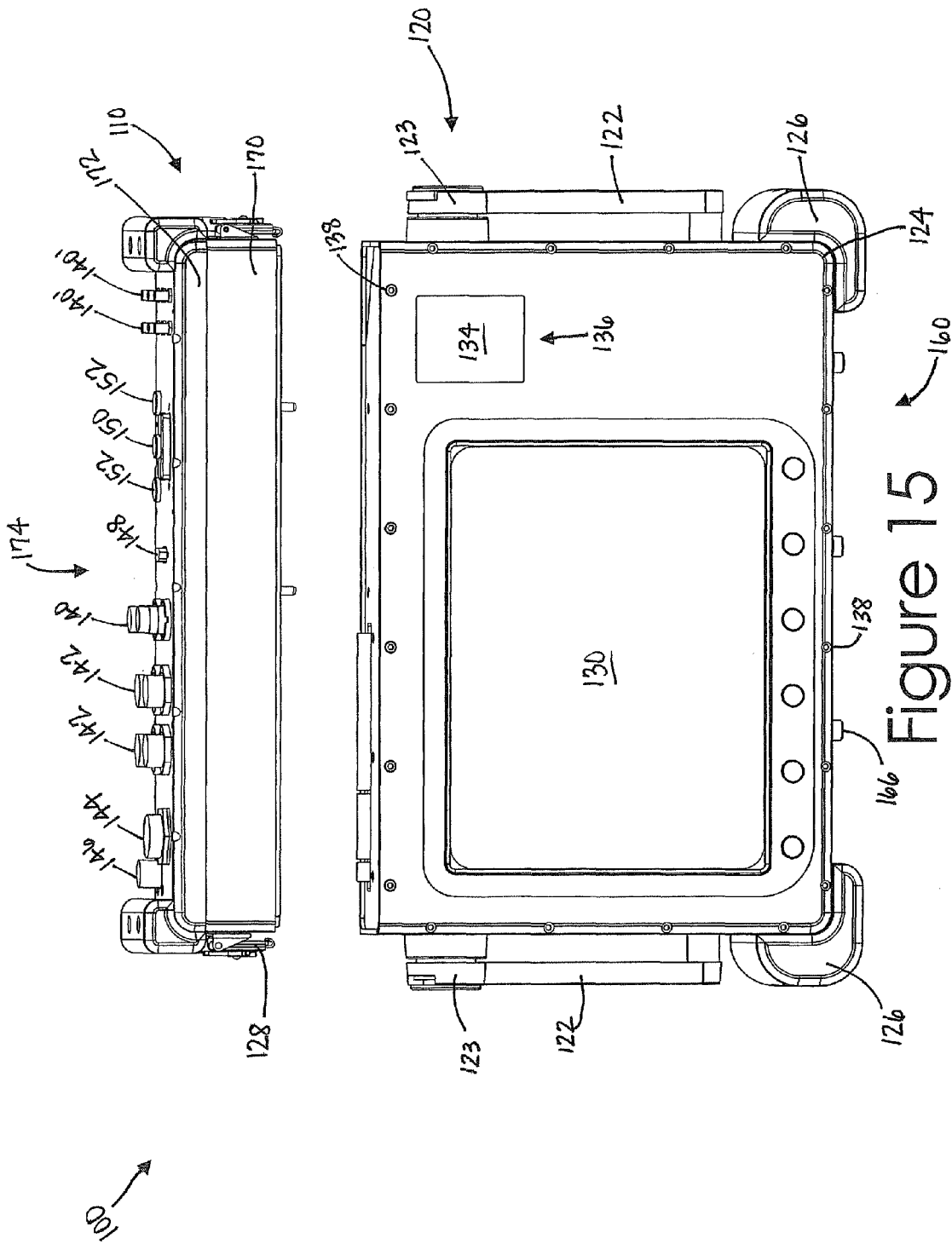

MODULAR TEST SYSTEMS FOR SEVERE ENVIRONMENTS

RELATED APPLICATION

The present application is being filed as a non-provisional patent application claiming priority/benefit under 35 U.S.C. §119(e) from U.S. Provisional Patent Application No. 61/153,116 filed on Feb. 17, 2009, the entire disclosure of which is incorporated herein by reference.

FIELD

The present invention relates generally to test equipment and, more particularly, to test equipment that is adapted for use in severe environments.

BACKGROUND

Modern military and industrial equipment typically comprise a multitude of systems, subsystems and circuits. In order for this equipment to be maintained, there must be a facility that allows those individual systems, subsystems and circuits to be tested, whether for preventative maintenance or to diagnose faults.

Military and industrial equipment must often be used in locations that are distant from or inaccessible to these facilities, such as clean shop environments. For instance, when mechanical equipment breaks down, the equipment may be disabled in a remote location. If the proper test equipment were available, a number of faults, including faults in the control electronics and other systems, could be diagnosed and repaired at the remote location, thereby minimizing down time and eliminating the need to transport the equipment to a repair facility.

Test equipment for field use must be able to operate in an environment of temperature extremes, electromagnetic radiation, and electronic countermeasures, as well as dirty, dusty, wet and/or humid environments. Conventional test equipment suffers from limitations that prevent or otherwise limit its effective use in extreme conditions and environments.

Conventional test equipment is also limited in that users often need to learn to use a large number of individual test devices, each of which may require different training in order to effectively operate and employ the test equipment. One reason for the absence of uniformity in operator interfaces among test equipment is that each piece of test equipment often provides an interface suitable only for a particular piece of machinery to be tested and possibly to a particular system or subsystem being tested. Thus, there is a need for a test bed that provides a common user interface. There is also a need for a system that allows the test bed to interface with a variety of different systems and equipment.

In a case where test equipment may be needed to test a variety of related equipment, such as often occurs in military applications, it would be desirable to allow the same test bed to be rapidly reconfigured for use with both different equipment interfaces and a number of different testing methods, without the need for different or additional pieces of equipment. Moreover, when a piece of test equipment itself requires repair or updating, it would be advantageous if defective parts could be easily replaced and outdated components updated without the need to replace the entire test equipment.

As noted above, conventional test equipment suffers from a number of limitations that limits effective use of the equipment in severe environments. For example, the sensitive electronics and components of a test system, such as those operated as part of a commonly available laptop computer, are at risk of exposure to the environment, including temperature extremes, dirt and water. In order to hermetically seal the sensitive electronics from the environment, the electronics could be sealed within a box. Modern electronic circuits produce substantial heat and the necessity to cool the electronics, including microprocessors, lead essentially all laptop type computers to utilize direct air exchange between the environment and the electronics, oftentimes through use of a forced air fan. When air-exchanging laptops are used in severe environments, the forced air introduces into the case detrimental contaminants including humidity, dirt, and possibly also radiological and biological contaminants. In such a case, even if the test equipment did not fail due to contamination, removal of detrimental contaminants would be difficult, if not impossible. Thus, test equipment that is exposed to the environment may be rendered unavailable at crucial moments, when most needed.

In view of the above, there exists an unmet need for an apparatus and system that provides a modular test equipment bed which is both adaptable for use in the field, especially in severe environments, and which is highly modular so that the test equipment bed can be utilized for testing a diverse array of equipment.

SUMMARY

The general inventive concepts contemplate a modular equipment testing apparatus suitable for use in severe environments. In one exemplary embodiment, the testing apparatus comprises a base computing unit, one or more interchangeable test instrument boards, and one or more interchangeable equipment interface pods, wherein the base computing unit and the interchangeable test instrument boards are sealed within an instrument case.

In one exemplary embodiment, the instrument case comprises a top panel displaying a touch-screen interface, at least one side panel with a sealable case access door, a back panel with a sealable equipment interface pod connector and a bottom panel formed of heat conducting material. In one exemplary embodiment, the equipment interface pod comprises a sealable computing unit interface connector and one or more equipment interface connections. The instrument case and the equipment interface pod, when mated and locked together, form a hermetically sealed case interior such that environmentally sensitive components of the apparatus are sealed within a case that that is capable of sustaining a drop of 1 meter to a solid surface (e.g., floor) and immersion to a depth of 0.5 meters in water without damage to the internal sensitive components or rupture of the case.

In one exemplary embodiment, the base computing unit and the test instrument boards are cooled by means of conduction between the heat generating components of the base computing unit and the test instrument boards and a portion of the case bottom panel or adjacent structure formed of heat conducting material that is functionally effective as a heat sink while maintaining an hermetic seal isolating the base computing unit and the test instrument boards from the outside environment.

In one exemplary embodiment, more than one equipment interface pod is provided with each interface pod adaptable for providing a variety of connections between specialized equipment being tested and the base computing unit. Such equipment interface pods are provided in a variety of differing configurations that may be interchanged to allow the base computing unit to function as a test bed for a wide variety of equipment with differing connection requirements.

In one exemplary embodiment, the modular testing equipment apparatus computing unit further comprises an analog to digital converter that is capable of operating at greater than 250 MHz, and said converter is sufficiently efficient that it does not produce more heat than can be removed from the case interior by conduction cooling.

In one exemplary embodiment, the apparatus is further embodied as a synthetic instrument, wherein the computing unit, test instrument boards and interchangeable equipment interface pods provide a generic hardware system and in conjunction with test bed integration software, the synthetic instrument can function as a volt/ohm meter, an oscilloscope, a signal generator, a trouble code reader, and a video display to perform a variety of test equipment functions without requiring alteration of the apparatus hardware.

In one exemplary embodiment, the test apparatus includes an antenna system for delivering wireless signals into a sealed case of the test apparatus. The antenna system comprises a flat external collecting array affixed at the surface of the sealed case, typically in a depression in a surface of the sealed case. The antenna system also comprises an antenna interface that projects from an interior surface of the antenna array, with the antenna interface comprising a pressure fitting connection. The antenna system further comprises a case antenna connector disposed at the interior of the sealed case comprising a pressure fitting connection compatible with the antenna interface. Thus, the antenna array can electrically connect the case antenna connector with equipment disposed inside the sealed case, wherein the external surface of said array covers the antenna interface, allowing a hermetic seal over the antenna interface while maintaining the integrity of the sealed case. A separate adhesive antenna array cover may be provided to protect the antenna from damage.

Numerous advantages and features attributable to the general inventive concepts will become readily apparent from the following detailed description of exemplary embodiments, from the claims and from the accompanying drawings.

BRIEF DESCRIPTION OF THE DRAWINGS

For a fuller understanding of the nature and advantages of the general inventive concepts, reference should be had to the following detailed description taken in connection with the accompanying drawings, in which:

FIG. 15 shows a top view of the test bed apparatus of FIG. 1, with the interface pod separated therefrom.

DESCRIPTION

Figure 1:
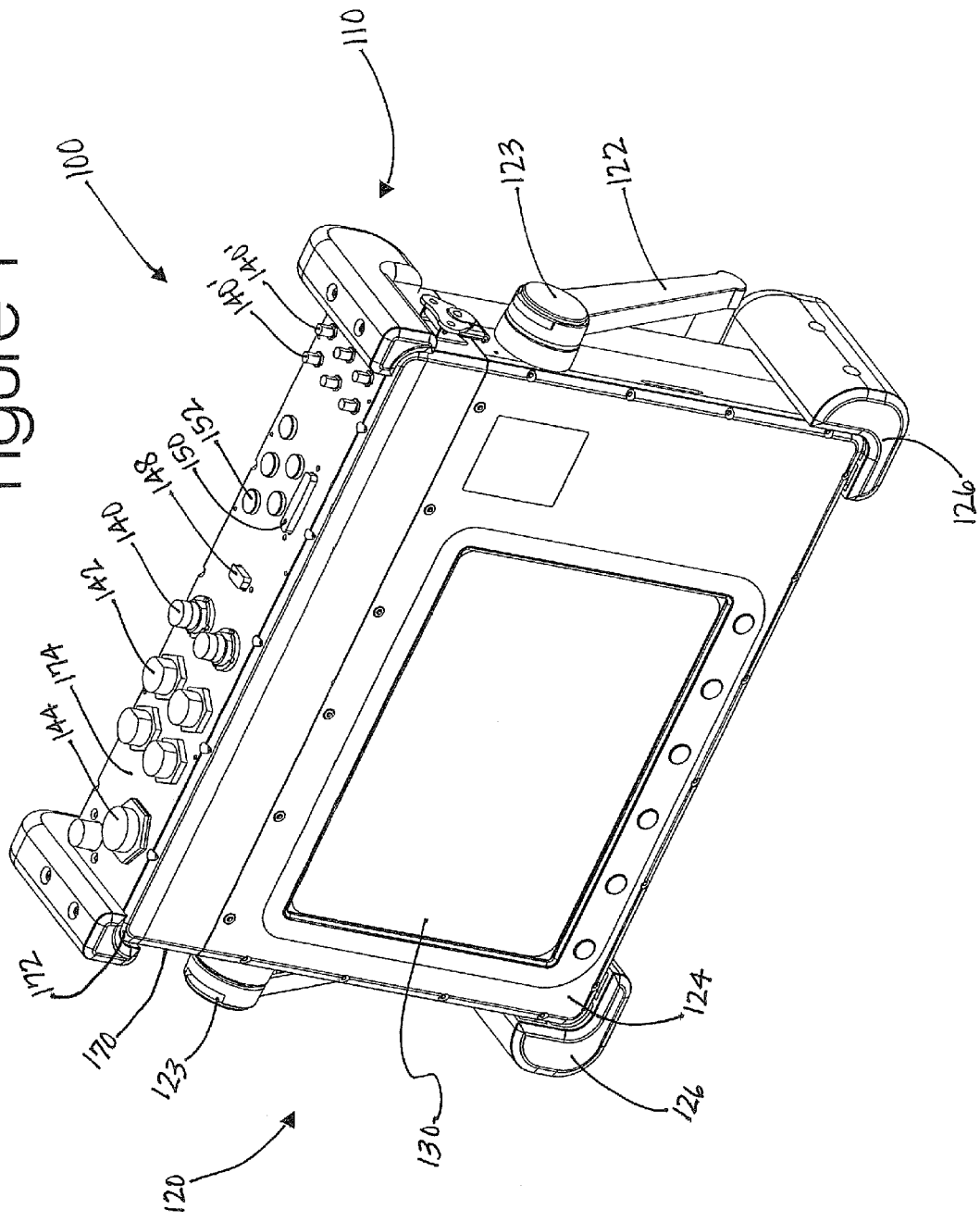
FIG. 1 shows perspective view of a modular equipment test bed apparatus, according to one exemplary embodiment.

While the general inventive concepts are susceptible of embodiment in many different forms, there are shown in the drawings and will be described herein in detail specific embodiments thereof with the understanding that the present disclosure is to be considered as an exemplification of the principles of the general inventive concepts. Accordingly, the general inventive concepts are not intended to be limited to the specific embodiments illustrated herein.

In accordance with the general inventive concepts, disclosed herein are exemplary embodiments of a universal, modular test bed apparatus 100 and related systems and methods for producing test data. The apparatus, systems, and methods are readily adaptable for use in large organizations with a diverse collection of differing equipment, such as the military or large manufacturing operations. In addition, as equipment is updated or replaced, the apparatus can be readily updated to effectively run tests on the new equipment and a variety of related equipment.

The apparatus, systems, and methods allow for the testing of complex systems in severe or otherwise rigorous environments. In order to effectively function in severe environments, a case enclosing the test apparatus is sealed. Thus, the general inventive concepts contemplate an apparatus that provides for cooling of its microprocessor and other power consuming components.

The general inventive concepts also contemplate an apparatus that functions as a multifunction test bed, which is expandable to provide new testing capabilities without replacement of the entire apparatus. The system and apparatus are thus adaptable for use by a large organization, providing a common interface, while allowing alternatives to test input and output functionality.

FIG. 1 shows a perspective view of a test bed apparatus 100, according to one exemplary embodiment. The test bed apparatus 100 provides an interchangeable, detachable equipment interface pod 110; a hermetically sealed computing case 120 (including various internal components); and a touch-screen user interface 130. In one exemplary embodiment, the touch-screen user interface 130 is implemented by a touch-sensitive LCD assembly. In one exemplary embodiment, user interactive buttons (not shown) are provided instead of or in addition to the touch-screen user interface 130.

The computing case 120 is provided with an adjustable stand 122, rounded corners 124, and shock absorbing bumpers 126. The interface pod 110 is removably attached to the computing case 120, and may be held in place by pod cam lock clips 128. As part of the interface pod 110, data ports and or signal interface ports such as at 140, 142, and 144 are provided. Interface pod 110 is enclosed inside a pod case 111 comprising pod base 170, pod cover 172, pod front 174 (not shown in FIG. 1), and pod back 176.

Figure 2:
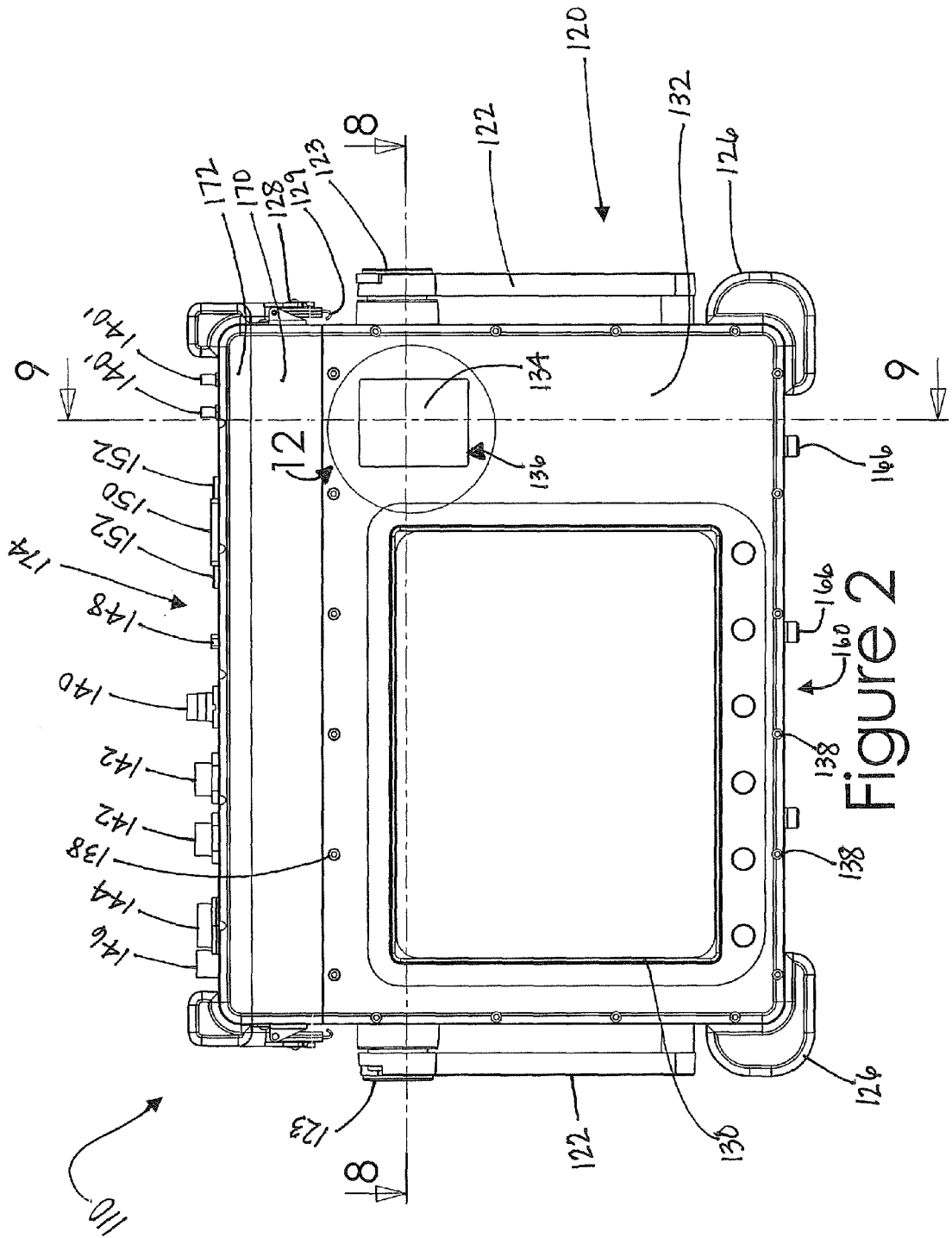
FIG. 2 shows a top view of the test bed apparatus of FIG. 1 (including an interface pod)

A top view of the test bed apparatus 100 is shown in FIG. 2. The modular equipment test bed apparatus 100 is shown with the detachable equipment interface pod 110 connected to the computing case 120 including the touch-screen interface 130. The adjustable stand 122, which pivots about stand pivots 123, is shown folded behind the computing case 120 in the "stowed" position, nested behind the bumpers 126. The interface pod 110 is held in place by the pod clips 128, which latch onto computing unit cam lock clips 129, both set of clips being riveted, for instance, to their respective cases 111 and 120.

A computing unit cover 132 supports the touch-screen interface 130, and an antenna 136 is disposed behind an antenna cover 134 (see FIG. 2). As part of the interface pod 110, various data ports, such as data ports 140 and 140', and signal interface ports 142, are shown. The data ports 140 and 140' are different iterations of coaxial connectors, for instance audio and video, respectively. Signal interface ports 142 are configured as Universal Serial Bus (USB) protocol compatible connectors. Additionally, port 144, as shown in FIG. 2, is an Ethernet connection, while port 146 is an Amphenol 10SL connector. Multi-pin connector female plug 148 is a VGA video connection. Multi-pin connector female plug 150 is an EC01-44 25-pin connector. Ports 152 are J16-20 connectors.

The computing case 120 includes a front panel 160 comprising a sealable door 164. In one exemplary embodiment, the front panel 160 is hingeably attached to the computing case 120. In one exemplary embodiment, the front panel 160 is removably secured to the computing case 120 by the retainers 166. By way of example, the cases of the computing unit 120 and the interface pod 110 are held together, at least in part, by Allen head screws 138.

Figure 3:
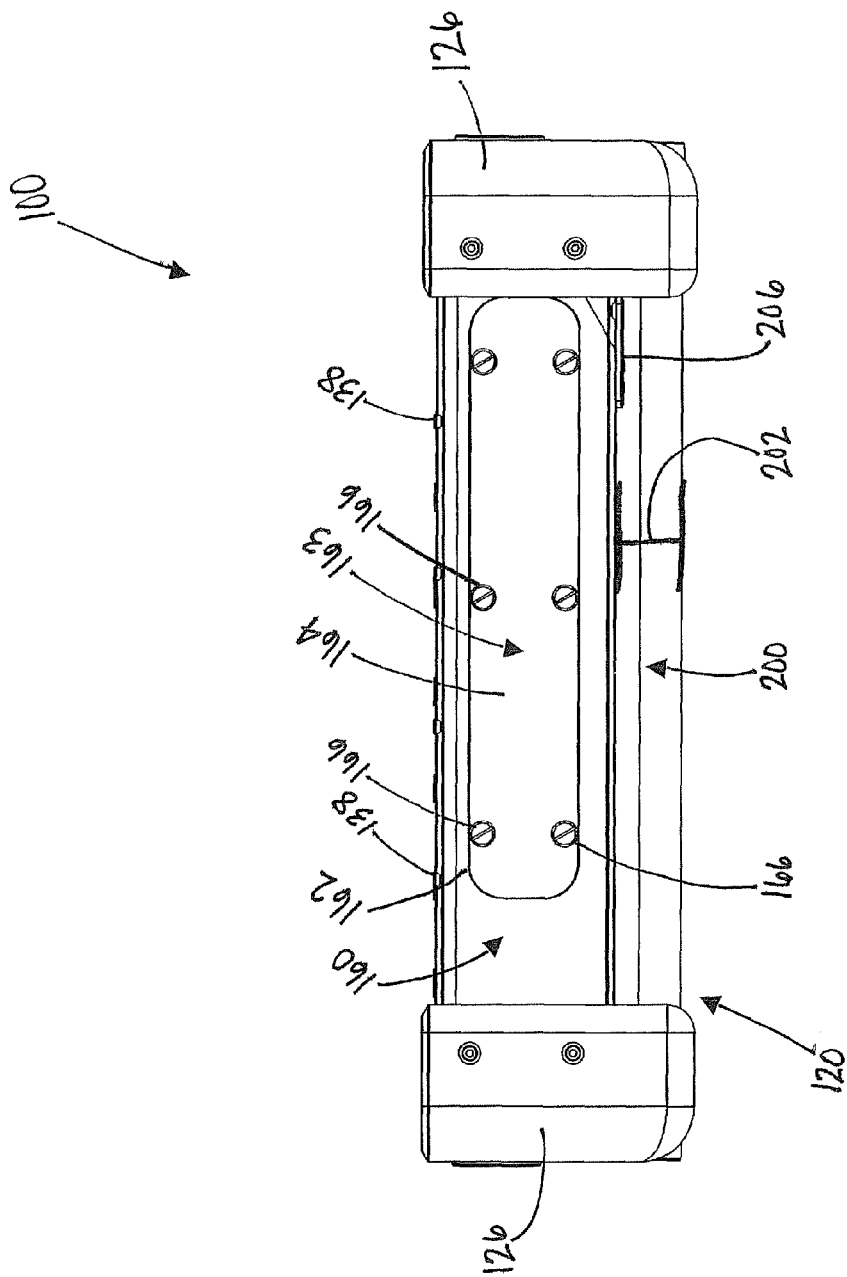
FIG. 3 shows a front side view of the test bed apparatus of FIG. 1.

FIG. 3 shows a front view of the test bed apparatus 100 of FIG. 1. The computing case 120 is protected from impact and scraping by the bumpers 126 which are, for example, constructed of a resilient material, such as rubber. The computing case 120 of the test bed apparatus 100 is, for example, made of a rigid material, such as aluminum or a glass reinforced plastic polymer. The bumpers 126 separate a bottom panel 200 from a surface upon which the test bed apparatus 100 is resting, creating a space 202 therebetween (see FIG. 3). As shown herein, heat-producing components of a computing core of the test bed apparatus 100 are generally located in close proximity to the bottom panel 200. Thus, in one exemplary embodiment, the bottom panel 200 functions as a radiator of heat evolved from the computing core, including PCI eXtensions for Instrumentation (PXI) cards and/or other associated modules. The space 202 created by the bumpers 126 allows for efficient removal of heat from the surface of the bottom panel 200. Also shown in FIG. 3 is the side view of PXI cover retainer 206.

In front panel 160, front panel frame 162 provides an opening, front panel bay 163, covered by sealable front panel door 164 secured, for example, by the door retainers 166. The front panel 160 of the computing case 120 is, for example, hingeably attached to the computing case 120 or removably secured thereto by the retainers 166. The front panel door 164 of the front panel 160 provides access to the interior of the computing case 120, allowing for removal or insertion of modular components, such as computing unit instrument PXI cards 221, batteries, or the like. The front panel door 164 will typically be opened only in clean environments, under relatively controlled conditions, in order to change the functionality of the modular test bed apparatus 100, repair the computing case 120, update the test bed apparatus 100, or replace a power source (e.g., a rechargeable battery system).

Figure 4:
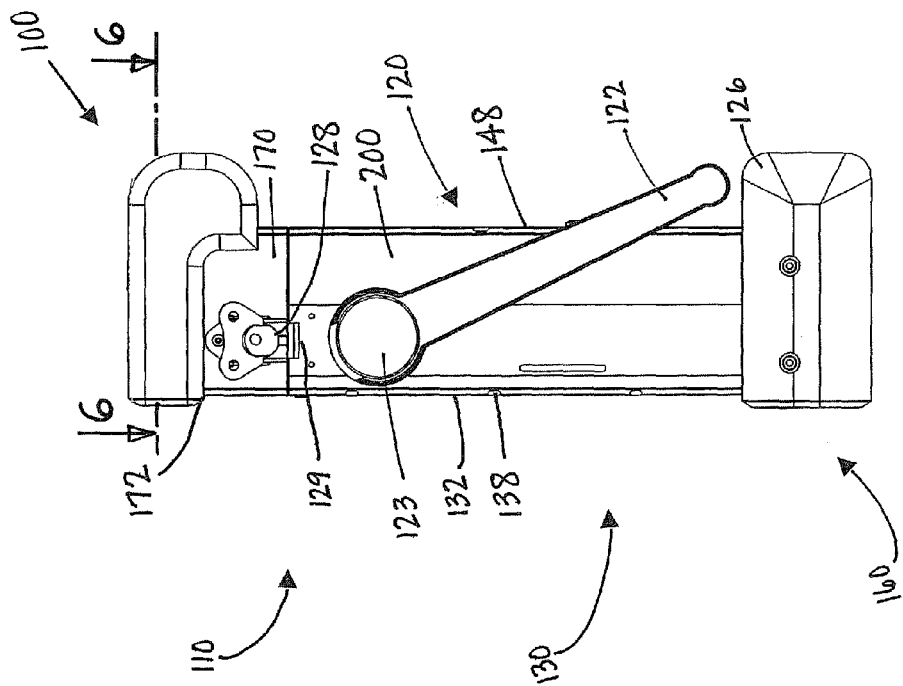
FIG. 4 shows a right side view of the test bed apparatus of FIG. 1.

FIG. 4 shows a right side view of the test bed apparatus 100 of FIG. 1, including the equipment interface pod 110 connected to the computing case 120 having the touch-screen interface 130. The stand 122 is again shown folded behind the computing case 120 in the "stowed" position. The interface pod 110 is held in place against the computing case 120 by the pod clips 128 fastened by a cam detent to the case clip 129. As part of the interface pod 110, data ports 140 and signal interface ports 142 are shown, as is the position of case bottom panel 148.

Figure 5:
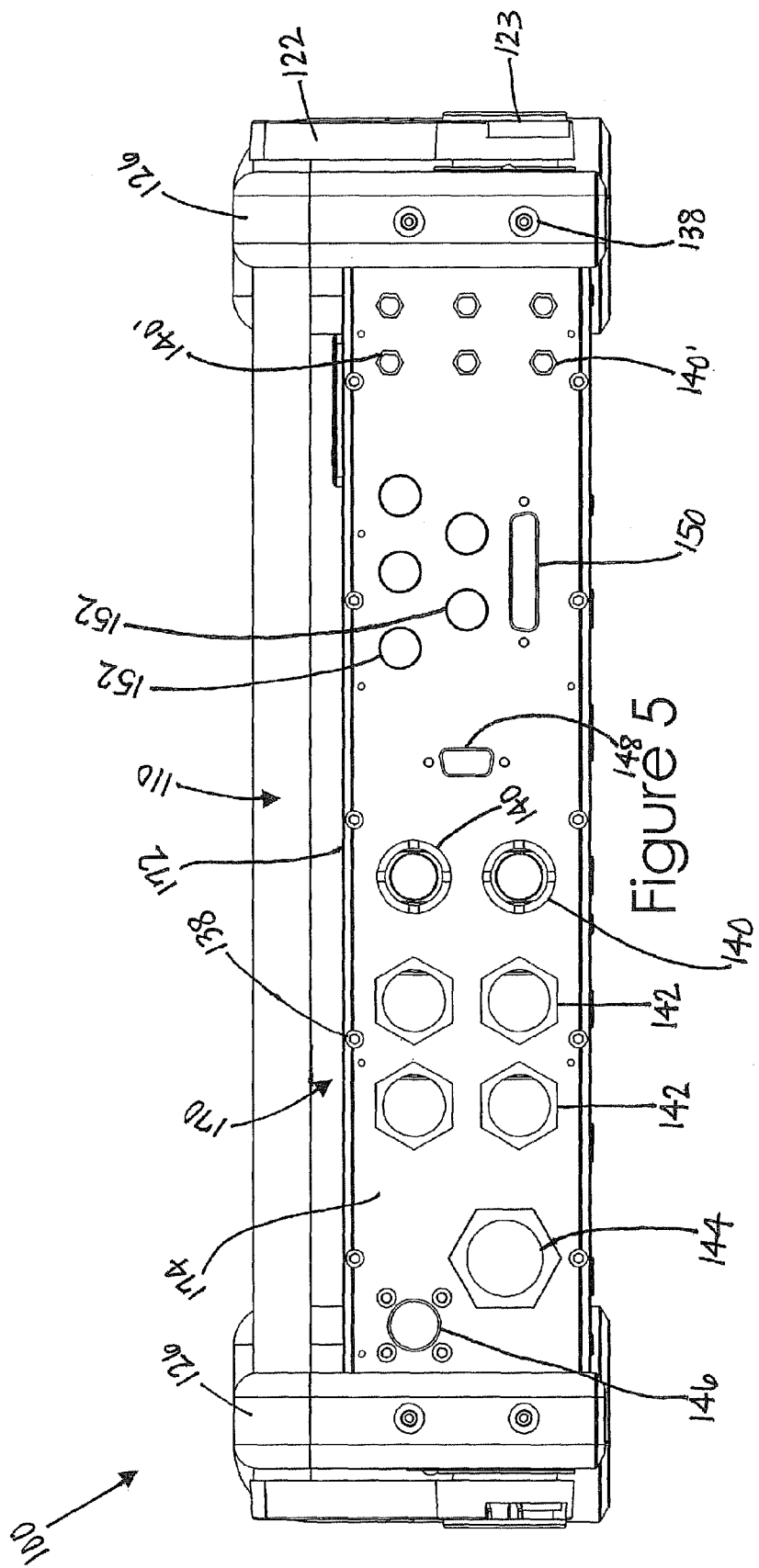
FIG. 5 shows a rear side view of the test bed apparatus of FIG. 1, according to one exemplary embodiment.
Figure 6:
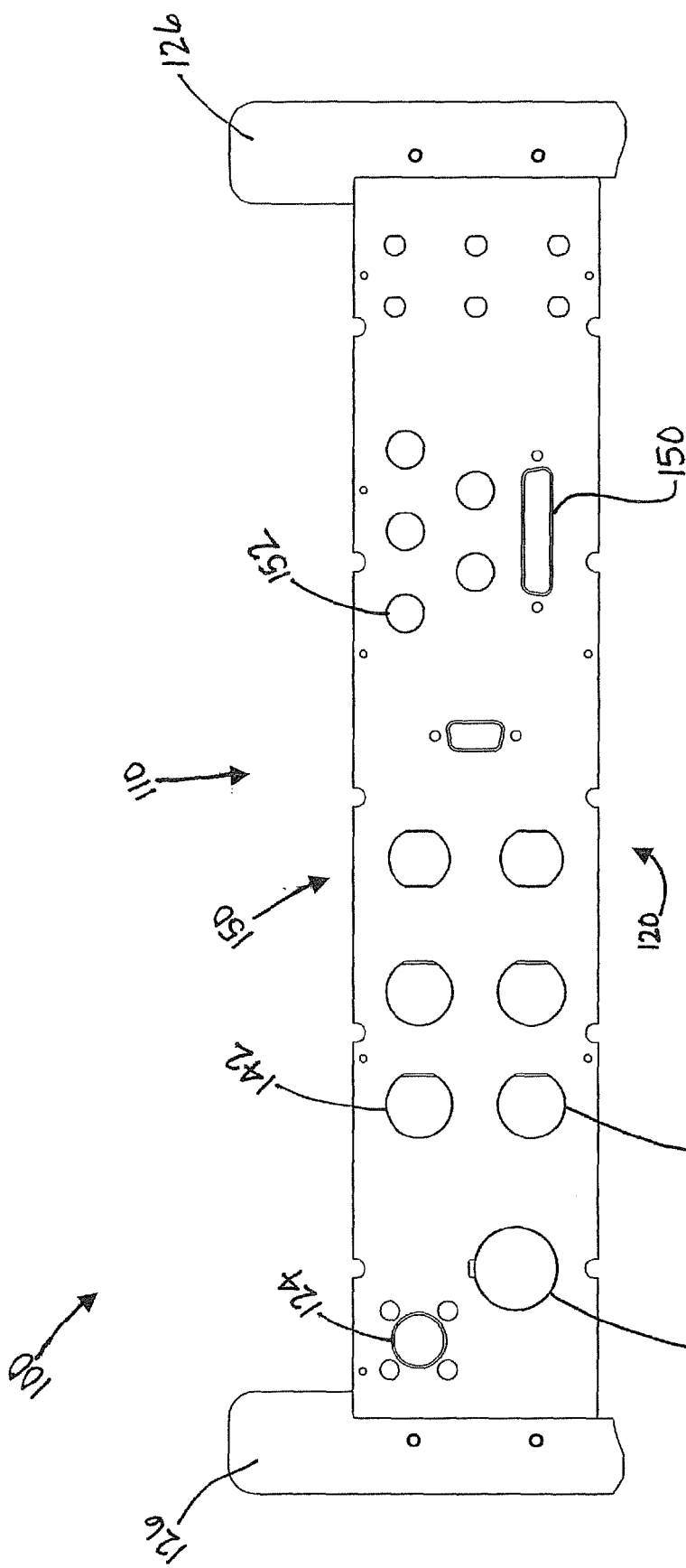
FIG. 6 shows a cross-sectional view of the test bed apparatus of FIG. 1, along line 6-6 (extending through the interface pod) in FIG. 4.

FIG. 5 shows a rear view of the equipment interface pod 110. The bumpers 126 and the stand 122 are shown as associated with the computing case 120 of the test bed apparatus 100. In FIGS. 5 and 6, the stand handle 127 has been removed. On the interface pod 110, the data ports 140 may be provided in alternative forms, such as at 140', fitting the specific applications of the equipment to be tested. A plurality of signal interface ports, such as the signal interface ports 142, may be provided to receive signals from one or more sources, and alternative versions may be provided, such as multi-pin connectors (e.g., RS-232 connectors), Firewire connectors, or USB connectors. Exemplary interface connectors are discussed with respect to FIG. 2, and variations thereof would be familiar to those skilled in the art. All of the direct electrical connections for outside signal and or data sources are channeled through the interface pod 110, allowing the interface pod 110 to be utilized as a replaceable unit, if need be, while maintaining the integrity of the hermetically sealed computing case 120. FIG. 6 likewise shows a cross-sectional view of the equipment interface pod 110, along the plane 4-4 of FIG. 4.

In one exemplary embodiment, the interface pod 110 provides electrical isolation with the components inside the computing case 120, and preferably provides isolation to 10 kV. Thus, the interface pod 110 may include sacrificial components that are replaceable, such as fuses, fusible links, or the like, thereby protecting the most valuable components of the test bed apparatus 100 from damage when testing equipment that is capable of producing high voltage impulses or other potentially damaging electromagnetic activity.

Figure 7:
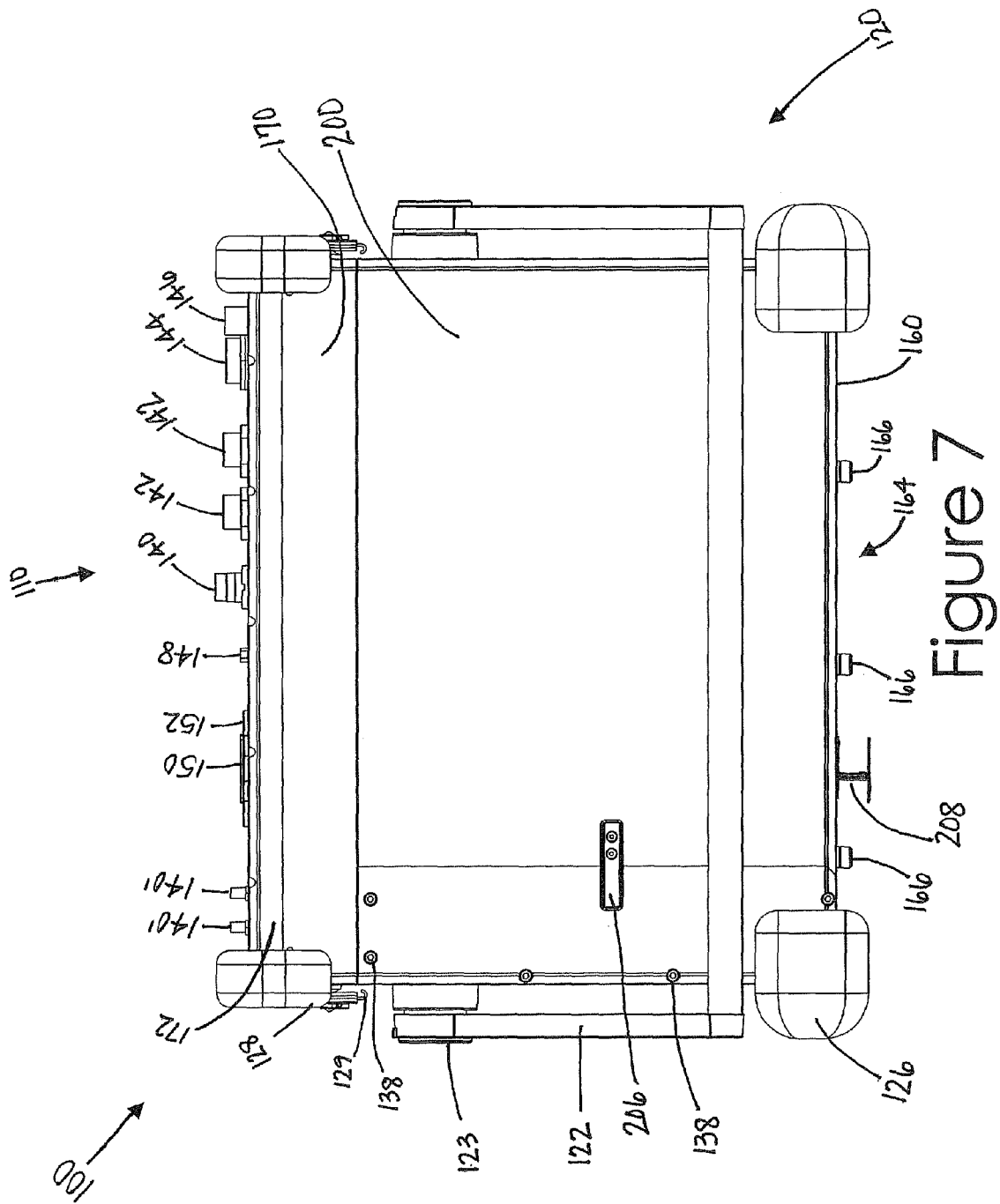
FIG. 7 shows a bottom view of the test bed apparatus of FIG. 1.

FIG. 7 shows a bottom view of the test bed apparatus 100 of FIG. 1 and its connections. The bottom panel 200 and PXI cover 204, are shown, as is PXI cover retainer 206. The bumpers 126 and the stand 122 again are shown as associated with the computing case 120 of the test bed apparatus 100. A plurality of signal interface ports 140, 142, and 148 are shown on the interface pod 110, as discussed above in connection with FIGS. 2 and 5. As was noted with respect to FIG. 3, the bumpers 126 are configured to set the computing case 120 at a distance apart (shown as space 202) from a supporting surface when at rest, that is when the case 120 of the test bed apparatus 100 is set in the upright position, as shown in FIG. 1. The bumpers 126 also create a space, indicated as front panel stand-off space 208 (see FIG. 7). Thus, it will be recognized in connection with the exemplary computing case 120 for the test bed apparatus 100 shown herein that a provision is supplied to ensure that the surface that has been described as the bottom panel 200 is accessible to air circulation.

As noted above, the test best apparatus 100 is able to achieve efficient cooling of its components. In one exemplary embodiment, maintenance of spaces 202 and 208 allows convection and radiation of heat from the bottom panel 200 of the computing case 120. The bottom panel 200 is formed in a manner that promotes efficient evolution (i.e., removal) of heat from the interior of the computing case 120. The evolution of heat from the computing case 120 preferably does not require direct air exchange between the case interior and the surrounding environment, preserving the hermetic seal of the computing case 120 in general use, thereby avoiding contamination of the components in the case 120.

In other exemplary embodiments of the test bed apparatus 100, additional enhancements of heat evolution from the case interior may be provided. Such enhancements could include, for example, the mounting of heat radiating fins on the outside of the bottom panel 200, providing forced air passage across the surface of the bottom panel 200, or even the use of cooling devices, such as a coolant circulating heat exchanger. Such enhancements may be necessary in particularly extreme environments, or when power consumption of the apparatus is particularly high.

The computing case 120 is arranged to provide for efficient cooling of its interior. The various components of a portable computer, such as a computer capable of running a version of the Windows operating system (Windows being a registered trademark of Microsoft Corporation), are mounted inside the computing case 120. One of ordinary skill in the art will appreciate that other computer software (e.g., other operating systems) and hardware components are readily adaptable to the general inventive concepts disclosed herein. Inside the case 120 are a computer power supply, a power source (e.g., in the form of inductively rechargeable batteries), a computer motherboard with interface slots, and a video output interface, along with other computing components known to those skilled in the art.

The case interior is arranged to allow the user to choose and install a wide variety of components, such as PXI compatible slot-mounting computing boards, that will be able to provide the functionality necessary to successfully carry out the desired tests on equipment when employing the test bed apparatus 100 and related systems and methods. The PXI boards are provided with a formed cooling plate.

Figure 8:
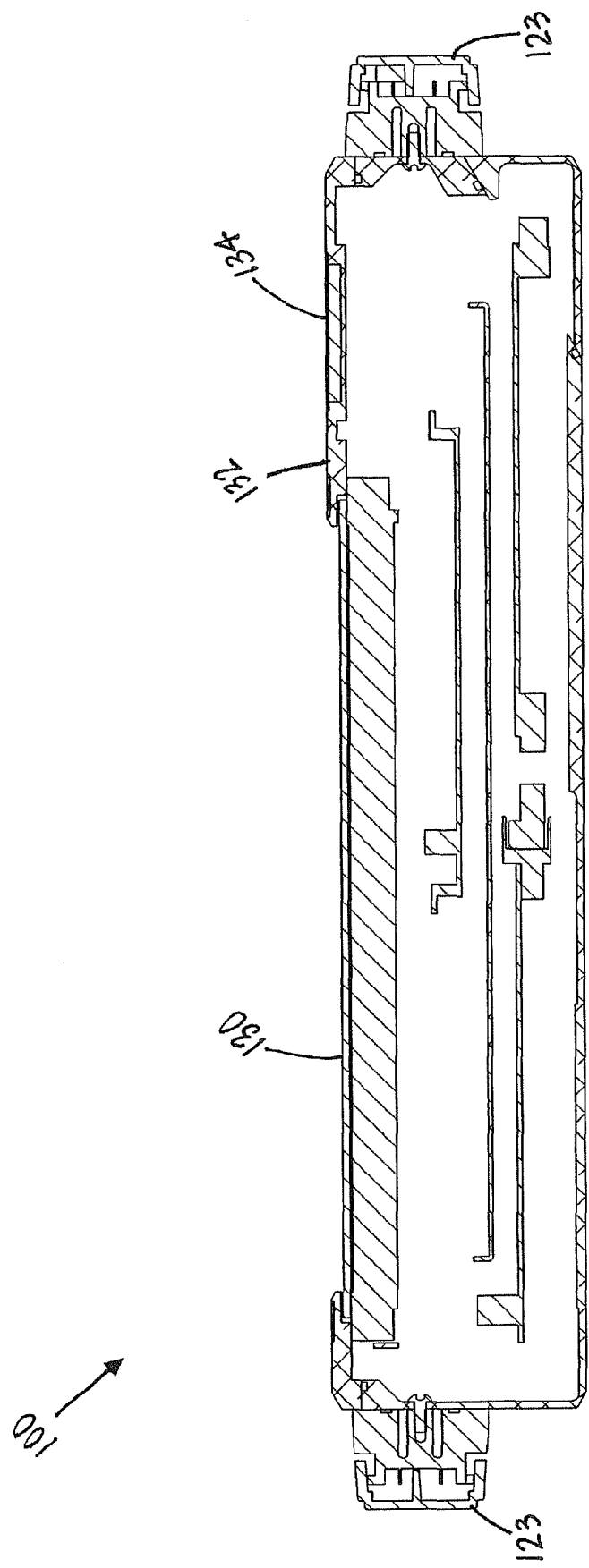
FIG. 8 shows a cross-sectional view of the test bed apparatus of FIG. 1, along line 8-8 in FIG. 2.
Figure 9:
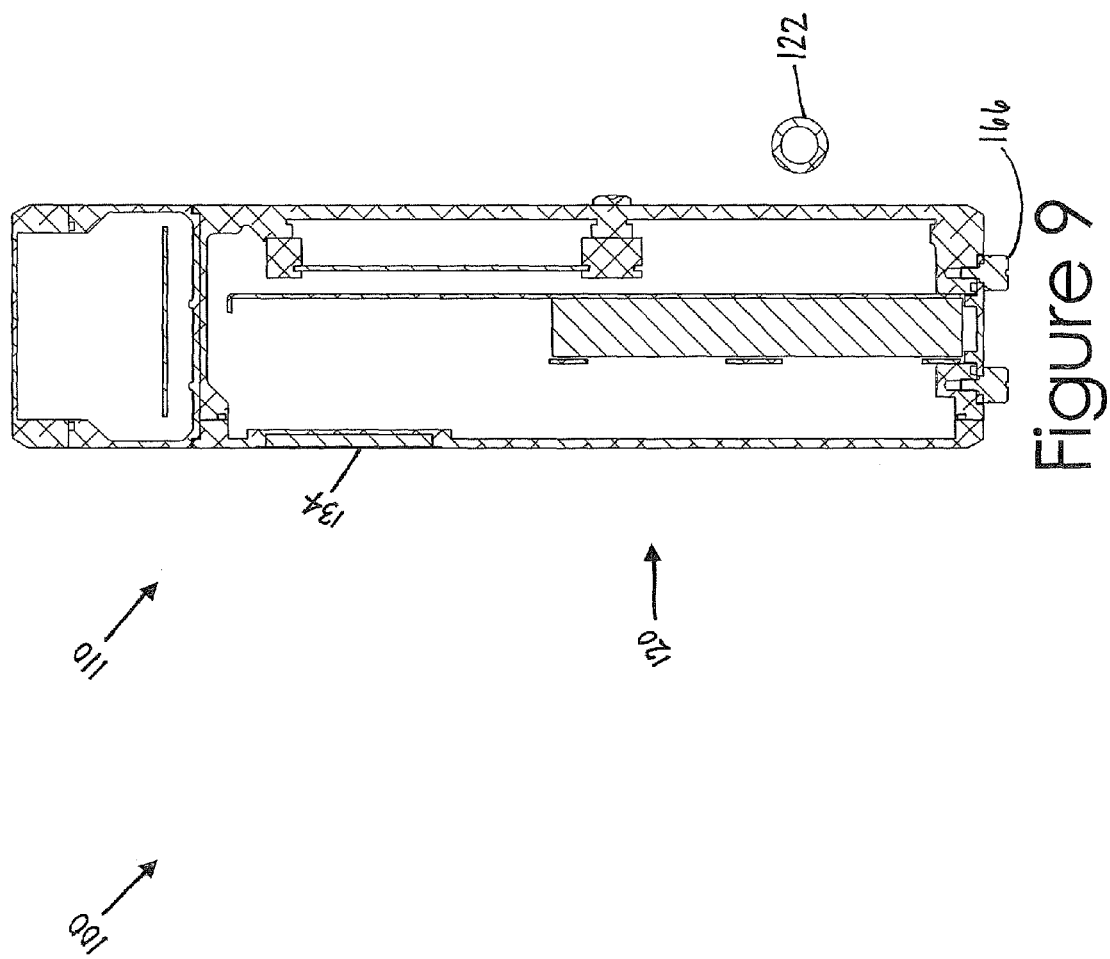
FIG. 9 shows a cross-sectional view of the test bed apparatus of FIG. 1, along line 9-9 in FIG. 2.

FIG. 8 shows a cross-sectional view of the test bed apparatus 100 along line 8-8 of FIG. 7, along with various computing unit components within the computing case 120. A memory slot 165 provides for mounting of a removable memory unit, such as a hard disk drive (not shown). Thus, the memory unit may be removed for security reasons, and the PXI board can be interchanged with other modular PXI boards to adapt the test bed apparatus 100 for other capabilities. Thus, by interchanging modular equipment interface pods 110 and the internal test instrument PXI-type boards, the modular test bed apparatus 100 can be readily adapted to provide the instruments and connectivity necessary for technicians to analyze a wide variety of different equipment. FIG. 9 shows a cross-sectional view of the test bed apparatus 100, along line 9-9 of FIG. 2.

Figure 10:
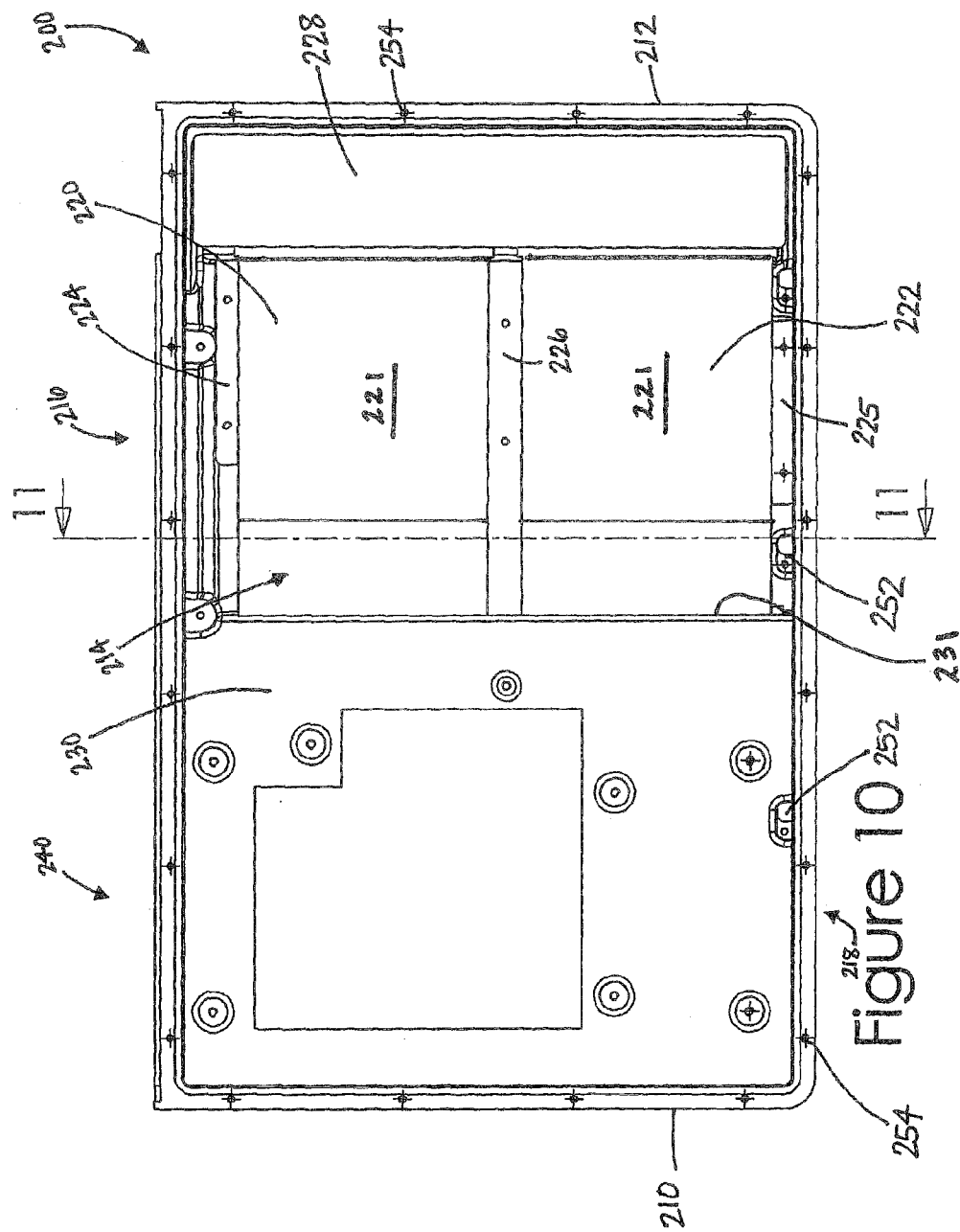
FIG. 10 shows a bottom panel, according to one exemplary embodiment, of a case of the test bed apparatus of FIG. 1.

The bottom of the computing case 120 is formed, for instance of machined aluminum, which serves as a cooling radiator and/or a heat sink. The interior surface of the case 120 is formed to closely mate with the combined heat sink and support system for the internal computing components, such as the test instrument PXI-type boards 221, allowing for effective cooling of computing hardware that is contained within the sealed computing case 120, while avoiding air exchange between the case interior and the external environment. FIG. 10 shows an exemplary embodiment of the interior of the bottom panel 200 that is machined from hardened aluminum and provides for a tight interface between the computer mother board and the PXI cards 221 and the bottom panel 200. As shown in FIG. 10, bottom panel end wall 210, PXI bay end wall 212, and bottom panel base 214, along with pod panel wall 216 and front panel wall 218, together form an integrally unitized bottom panel 200, essentially in the form of a shallow tray. Removal of the bottom panel 200 from the computing case 120 allows access to the interior of the case 120 and the electronic components contained therein. As described above, the computing case 120 is a hermetically sealed case, such that a gasket material would typically be applied to mating surface 219.

The bottom panel 200 is machined to provide for close contact between heat producing computing components mounted to the panel 200, including, for example, a computer CPU motherboard 231 and one or more test equipment PXI cards 221. Thus, heat producing components such as these and/or the heat sinks affixed to these or similar components may be placed in close apposition with the bottom panel 200, thereby providing for conduction transfer (i.e., evolution) of heat essentially directly from the heat producing components to the bottom panel 200, which is directly exposed to the outside environment. So long as the bottom panel 200 is in an environment that is at a lower temperature than the case interior, the bottom panel 200 will draw heat from the case 120 and release it to the environment. In those rare situations where the temperature differential between the environment and the case interior is insufficient to provide efficient cooling of the computing components, supplemental means may be employed to remove heat from the bottom panel 200, as described above.

As shown in the detailed arrangement of the bottom panel 200 in FIG. 10, two PXI card mounting bays 220 and 222 are provided. The PXI cards 221 and any associated heat sinks slide into the bays 220 and 222, and are retained in position, in part, by PXI card outside rail 224, PXI card rail 225, and PXI card center rail 226. The bottom panel 200 provides an opening for removal and placement of alternative PXI cards 221 through PXI card access bay 228. A motherboard bay 230 provides for mounting of a CPU motherboard 231, as well as a surface for association with motherboard heat sinks.

Opening through the pod panel wall 216 is a pod interface connector slot 240, which allows a male pod interface slot connector to pass through the pod panel wall 216, and mate with a female pod interface slot connector 239 disposed on a back panel 241 of the computing case 120 and associated with the motherboard mounted inside the computing case 120. The connector slot 240 may in some situations be provided with a gasket and or 0-ring to maintain the integrity of the sealed computing unit. Likewise, the front panel wall 218 provides a front panel door 250. The bottom panel 200 may also be formed with one or more mounting lugs 252 to provide secure means to assemble the case front panel 160 and the bottom panel 200 into a rugged computing case 120. As shown in FIG. 10, numerous fastener holes 254 are provided for accepting Allen head screws.

Figure 11:
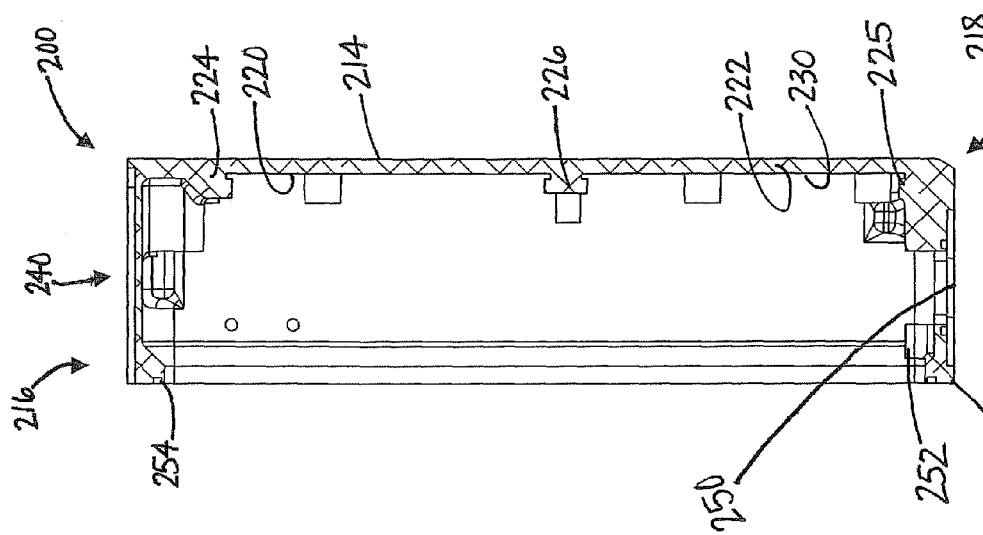
FIG. 11 shows a cross-sectional view of the bottom panel of FIG. 10, along line 11-11 in FIG. 10.

FIG. 11 shows a cross-sectional view of the bottom panel 200, along line 11-11 of FIG. 10. Again revealed are the flat surfaces of PXI card mounting bays at 220 and 222, along with PXI card outside rails 224 and 225, and PXI card center rail 226. At 230 is shown the surface of the motherboard bay. As also shown in FIG. 10, numerous fastener holes 254 extend through the bottom panel 200.

A wide variety of computing boards are adaptable for use with the test bed apparatus 100 and related systems and methods. For each type of board, a computing interface (e.g., a slot connector) is provided, along with sufficient space to accommodate the board itself, input and output capacity, an apparatus for allowing power to be delivered to the board, and a mechanism to provide cooling. Cooling of power consuming computing components has conventionally been accomplished by means of air-cooled heat sinks, forced air, and convection. Conduction cooling has been employed on occasion, but heretofore, conduction cooling has not been sufficiently efficient to allow power consuming computing components to be placed inside a hermetically sealed case.

For industrial applications, there are a number of semi-standardized computing boards systems. For example, some commonly employed interfaces include USB, Firewire, Peripheral Component Interconnect (PCI), Compact PCI, Compact PCI (CPCI), Apple Desktop Bus (ADB), Small Computer System Interface (SCSI), Ethernet and a number of other bus standards known in the art. For data acquisition, such as for data acquisition from a test instrument, PCI and CPCI are commonly used. The CPCI standard specifies an IEEE 1101.1 (Eurocard) PCI form, and provides a secure chassis mounting, cooling, and enhanced ruggedness.

An interoperable version of CPCI cards utilize the improved PXI specification. PXI is a standard developed by National Instruments of Austin, Tex., and presently maintained by an industry group, the PXI Systems Alliance. PXI systems utilize a PC-based platform combining the PCI electrical bus with the modular mechanical packaging of CPCI. PXI systems may be utilized in applications such as manufacturing, military, aerospace, machine monitoring, automotive, and industrial test systems.

In one exemplary embodiment of the test bed apparatus 100 and related systems and methods, a tablet computer unit is provided with interoperability connections to one or more slots for CPCI and/or PXI cards, one or more CPCI and/or PXI cards capable of providing test equipment functionality, and a slot-card removable connection for a detachable, exchangeable interface pod (i.e., interface pod 110); all of which is contained in a hermetically sealable case (i.e., computing case 120) that provides conduction cooling sufficient to prevent excessive heat build-up from the operation of the components contained within the case, when the case is sealed. The combination of a computer, test equipment cards (e.g., CPCI cards, PXI cards), an equipment interface pod, and a sealed case provides a ruggedized test bed apparatus suited for operation in severe environments.

In one exemplary embodiment of the test bed apparatus 100 and related systems and methods, the test bed apparatus comprises a synthetic instrument, wherein the computer unit, the test equipment card(s), the interface pod, and the case provide a generic hardware system that is capable of integrating a variety of signals through utilization of supplied test bed integration software, thereby allowing the apparatus to perform a variety of test equipment functions without alteration to the apparatus hardware.

The test bed apparatus 100 and related systems and methods also embody an improvement in analog and digital signal inter-conversion, providing a substantial improvement in the capture and generation of analog and digital signals, and a substantial increase in the resolution of the signals captured and/or created. Presently, the CIRTES system on a Field Programmable Gate Array (FPGA) is commonly utilized to support analog to digital (A/D) conversion. The typical maximum sampling frequency of these converters is 250 MHz (megahertz), and a much higher sampling rate is desirable. Unfortunately, existing converters operated at rates higher than 250 MHz are too bulky for efficient application in hand held test equipment, and additionally consume much more power. This increased power consumption leads to substantial increases in heat evolution, which results in increased demands on cooling mechanisms.

In one exemplary embodiment, the test bed apparatus 100 and related systems and methods incorporate trigger time interpolation. In a wide number of testing environments, the test bed apparatus 100 will be employed for pass/fail testing of equipment components. Use of trigger time interpolation provides an enhancement of the criteria utilized for pass/fail testing. Present systems and methods provide only low precision pass/fail testing, while the test bed apparatus 100 and related systems and methods allow for more precise measurement of pass/fail criteria, thereby providing a reduction in false pass tests and a reduction in false negative tests. Thus, the test accuracy ratio of tests performed utilizing the test bed apparatus 100 and related systems and methods is increased, and the reduction in false readings, i.e., false pass/fail results, should reduce the unexpected failure of potentially critical components and the replacement of functional components.

The test bed apparatus 100 and related systems and method provide a modular equipment test bed that supports interchangeable equipment interface pods, such as the interface pod 110. As shown in FIGS. 5 and 6, the pod 110 provides for an Ethernet compatible network connection, video inputs and outputs, and USB compatible connectors that may be interfaced with equipment to be tested. The pod 110 itself is demountable, and replaceable with another equipment interface pod that may be configured to provide additional and/or alternative interfaces with equipment. Alternative pods would merely need to have the same dimensions for the pod base to allow mating with the computing unit interface. Whereas pod 110 is configured with an Ethernet connection and USB connectors, specialized secure network connections may be needed for certain applications, and an Ethernet connection would be undesirable, as would use of standard interface connectors such as USB connectors. The modularity of the test bed apparatus 100 and related systems and methods allow for ease of specialization of the interface pod for desired applications. When the computing unit is provided with a female configuration of a mating slot connector, so long as the interface pod is provided with a male configuration of a compatible mating slot connector, alternative pods may be installed by releasing the pod clips 128, removing the currently installed interface pod, and then aligning and locking down the alternative interface pod. The use of the cam lock clips 128 and 129 helps to ensure that when alignment pins are properly aligned, the cam lock will properly connect the mating slot connector between the computing case 120 and the interface pod 110. Thus, by interchanging alternative modular equipment interface pods 110 and the internal test instrument PXI-type boards, the modular test bed apparatus 100 can be readily adapted to provide the instruments and connectivity necessary for technicians to analyze a wide variety of different equipment.

An exemplary aspect of the modular test bed apparatus 100 and related systems and methods is that the sensitive components of the test bed apparatus 100 may be sealed within the computing case 120, such that there is no air exchange between the case interior and the external environment. Thus the test bed apparatus 100 can be assembled in a clean environment, and the components of the test bed apparatus 100 can be utilized in challenging environments with minimal risk of contamination to the internal components.

The modular nature of the test bed apparatus 100 allows rapid replacement of damaged parts without the need to replace or repair the entire apparatus. Moreover, technicians will not need to learn to use a large variety of equipment, since the modular test bed apparatus provides uniform systems and methods that use an instantly recognizable interface which minimizes the need for retraining.

In one exemplary embodiment of the test bed apparatus 100 and related systems and methods, an improved analog to digital converter provides an improved sampling rate. With the improved sampling rate, the efficiency and accuracy of equipment testing is improved, reducing the signal to noise ratio, and improving the ability to detect transient and/or short duration phenomena that may be diagnostic of an incipient problem, or an intermittent fault that is causing the analyzed equipment to malfunction or function at reduced efficiency.

The sealing of the test bed apparatus 100 in an environmentally stable case also creates a barrier to effective communication between the test bed apparatus 100 and electromagnetic signals that may need to be transmitted to the apparatus. In one exemplary embodiment, the test bed apparatus 100 and related systems and methods further include an antenna system 800 that provides an external surface mounted antenna, itself resistant to damage, and an antenna interface 820 that maintains the hermetic seal of the computing case 120. Thus, the antenna system 800 provides for delivering wireless signals to the sealed case 120. The chassis and internal components of the test bed apparatus 100 are connected to the antenna 136 (i.e., a flush mount antenna) through an improved pin connector.

Figure 12:
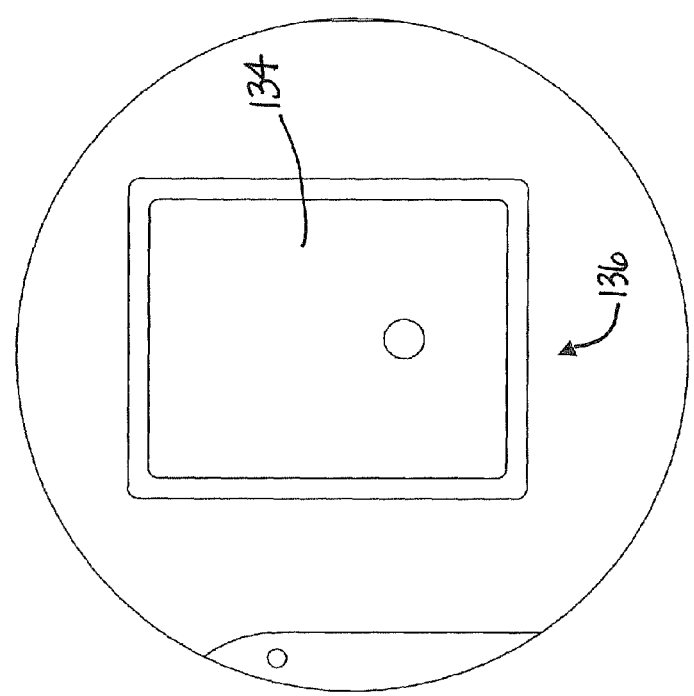
FIG. 12 shows a detailed view of the circular region encompassing an antenna system, according to one exemplary embodiment, for use with the test bed apparatus of FIG. 1.
Figure 13B:
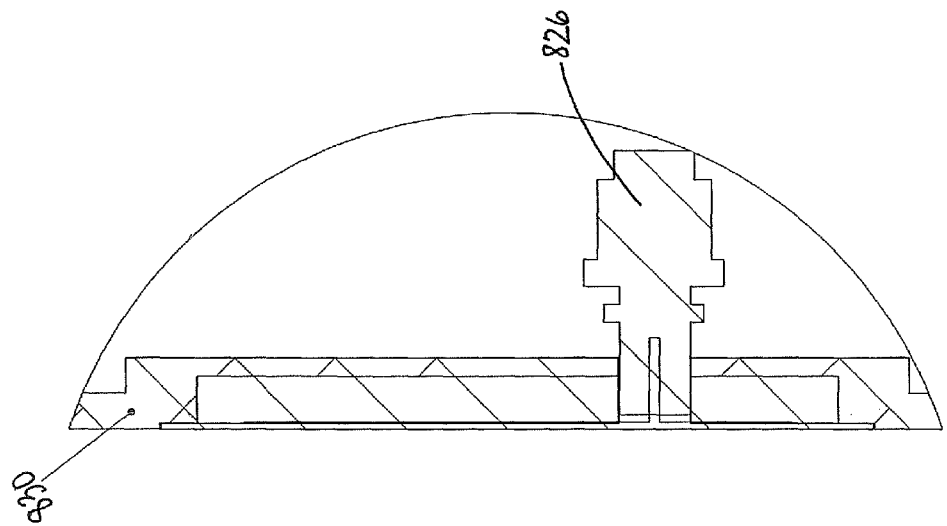
FIGS. 13A, 13B, 14A, and 14B show various cross-sectional and detailed views of the antenna system of FIG. 12.
Figure 13A:
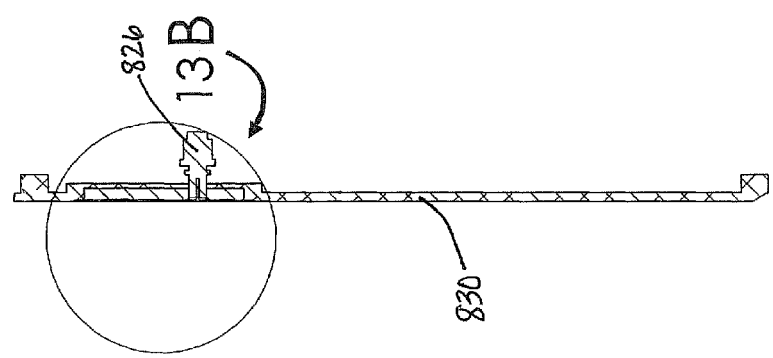
Figure 14B:
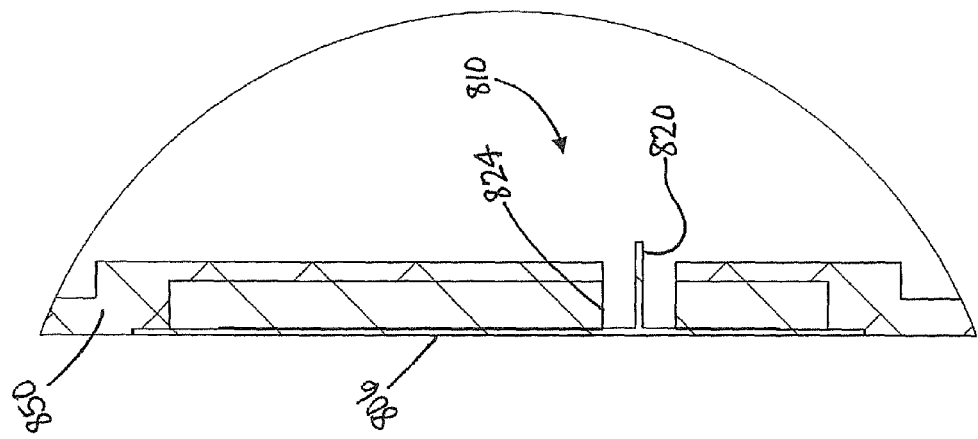
Figure 14A:
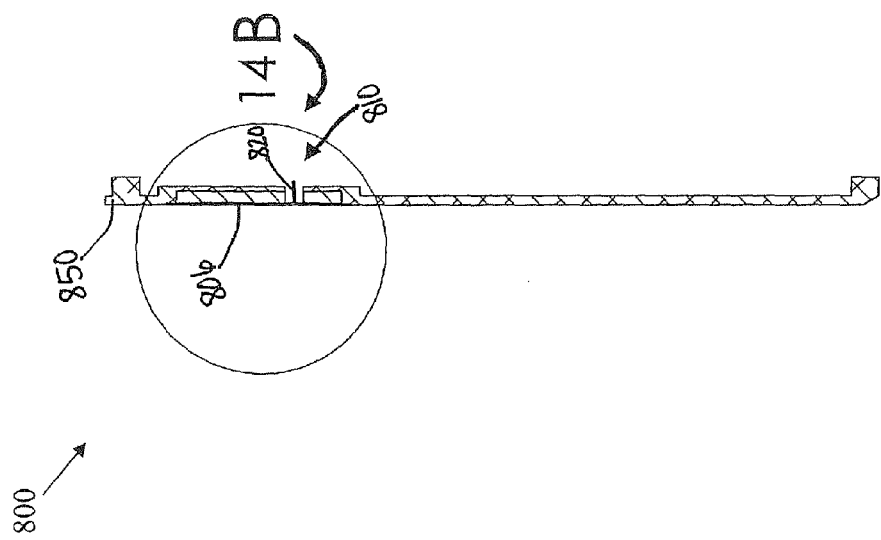
Figure 16A:
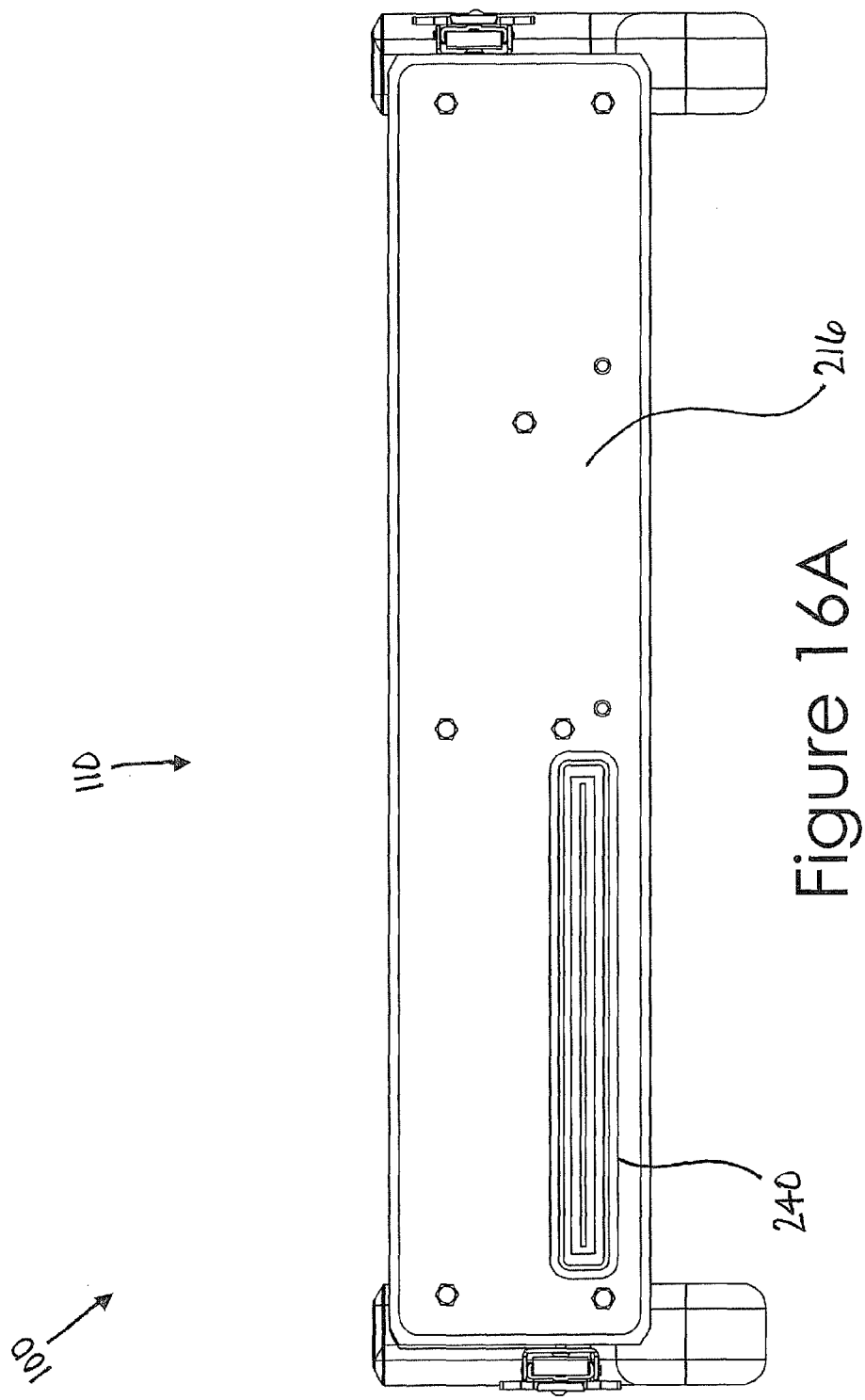
FIGS. 16A and 16B show complementary mating faces of the test bed apparatus and the interface pod of FIG. 15.
Figure 16B:
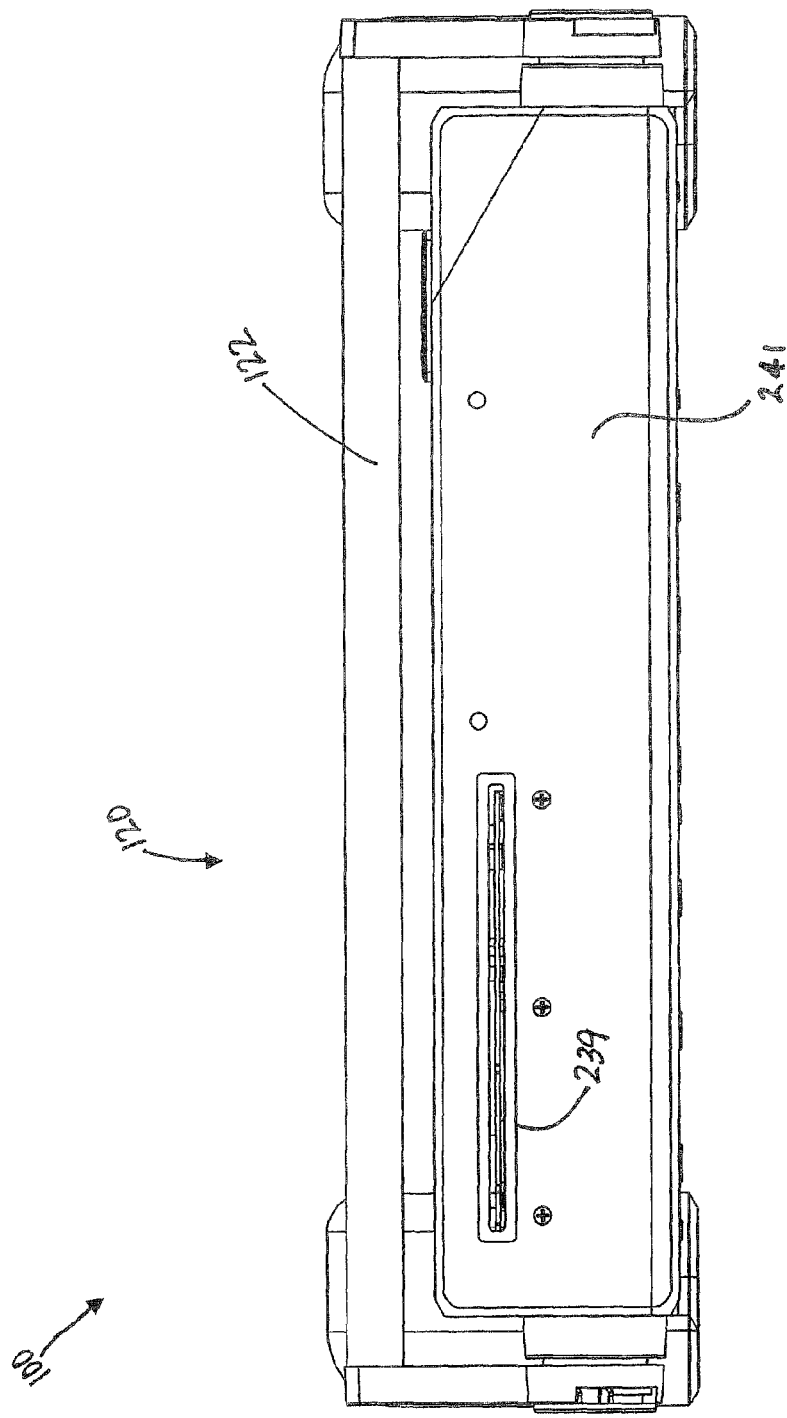

The exemplary antenna system 800 is shown in FIGS. 12-14, as a flush mount antenna on a metal case. The antenna system 800 allows communication of the test bed apparatus 100 with radio transmissions from remote sources, wireless internet connections, wireless telephonic transmissions, and wireless interaction with the equipment tested. For instance, a remotely piloted aircraft may be controlled by a wireless radio transmission, and that aircraft may also itself transmit data. In order to test and or maintain such an aircraft, it is advantageous to be able to mimic the remote piloting controls, and to analyze the facility of the aircraft to transmit responsive data. In another example, the test bed apparatus 100 could receive radio, microwave, cellular, and or satellite transmissions from a command and control system to, for instance, update test algorithms, provide responsive communications, direct specific tests to be performed, and even disable the apparatus if a security fault occurred.

FIG. 12 shows a top view of the exterior surface of the antenna system 800 providing for delivery of wireless signals 802 to the sealed computing case 120. A thin, electromagnetically transparent cover 804 (e.g., made of a suitable plastic or metal) covers the surface of the antenna external collecting array 806. The cover 804 may be integrally cast as part of the collecting array 806, or affixed to an external surface 807 of the array 806, such as by means of an adhesive or press fitting. The cover 804 and the antenna external collecting array 806 are disposed on an exterior 808 of the computing case 120, and the cover 804 and the antenna external collecting array 806, in combination, cover any associated opening in the case 120, such as antenna port 810 (see FIG. 12). Thus, a flat external collecting array is affixed at the surface of the sealed case 120. In one exemplary embodiment, the external collecting array 806 and the cover 804 are disposed in a cavity or depression 812 in the surface 814 of the computing case 120, with the cavity 812 providing for containing the flat external collecting array 806, and the cover 804 forming a planar surface of the case exterior 808, or slightly depressed from the case exterior surface 810. Thus, abrasion or displacement of the external collecting array 806 is minimized, while providing a smooth exterior for ease of cleaning the sealed computing case 120.

FIG. 13 is a cross-sectional view of an antenna interface 820 that projects from an interior surface 822 of the external collecting array 806. In one exemplary embodiment, the interface 820 comprises a pressure fitting antenna connector 824 that mates with case antenna connector 826 disposed at the interior of the sealed case 120, thereby forming a pressure fitting connection compatible with the antenna interface 820 and providing a capacity for electrically connecting the case antenna connector 826 with equipment disposed inside the sealed case 120. Typically, connectors 824 and 826 may utilize commercially available coaxial connectors or, alternatively, specialized connectors wherein connector 826 forms a hermetic seal. The case antenna connector 826 is fixed into antenna port 810, for example, by means of a threaded nut or by threads cut into the case 120 itself. The antenna port 810 allows passage of signals through the case chassis. Thus, in one exemplary embodiment, the external collecting array 806 of the antenna system 800 may be removed for replacement or renewal from the exterior of the sealed computing case 120, without breaching the seal of the case 120. The case antenna connector 826 is fitted with a lead or antenna board connecting the antenna with the wireless signal receiving components of the test bed apparatus 100. In one exemplary embodiment, the external surface of the antenna array 806 covers the antenna interface 820, so that when the antenna cover 804 is in place the antenna port 810 is sealed, allowing maintenance of an hermetic seal over the antenna interface while maintaining the integrity of the sealed case 120. As shown in FIG. 14, when the antenna system 800, or the entire case cover 850 is removed, the case cover 850 of the case 120 is separable from the underlying components mounted on the case chassis bottom.

The above description of specific embodiments has been given by way of example. From the disclosure given, those skilled in the art will not only understand the general inventive concept and its attendant advantages, but will also find apparent various changes and modifications to the structures and methods disclosed. It is sought, therefore, to cover all such changes and modifications as fall within the spirit and scope of the general inventive concept, as defined by the appended claims, and equivalents thereof.

What is claimed is:

1. A modular equipment testing apparatus suitable for use in severe environments, the apparatus comprising a base computing unit, an interchangeable test instrument board, and an interchangeable equipment interface pod, wherein the base computing unit and the interchangeable test instrument board are sealed within an instrument case comprising a top panel displaying a touch-screen interface, a front panel with a sealable case access door, a back panel with a sealable equipment interface pod connector and a bottom panel formed of a heat conducting material;

wherein the equipment interface pod comprises a sealable computing unit interface connector and one or more equipment interface connections;

wherein the instrument case and the equipment interface pod, when interfaced with one another, form a hermetically sealed case such that environmentally sensitive components are protected within an interior of the sealed case;

wherein the sealed case is capable of sustaining a drop of 1 meter to a solid surface and immersion to a depth of 0.5 meters in water without damage to the sensitive components or rupture of the sealed case;

wherein the base computing unit and the test instrument board are cooled by means of conduction between heat generating components of the base computing unit and the test instrument board and the bottom panel functioning as a heat sink while maintaining a hermetic seal isolating the base computing unit and the test instrument board from an external environment;

wherein the equipment interface pod is operable to provide a variety of connections between equipment being tested and the base computing unit;

wherein the equipment interface pod is operable to be interchanged with another equipment interface pod with a different configuration to allow the base computing unit to function as a testing apparatus with different connections, while maintaining the integrity of the sealed case.

2. The modular testing equipment apparatus of claim 1, wherein the base computing unit further comprises an analog to digital converter that is capable of operating at greater than 250 MHz, and wherein operation of the analog to digital converter does not produce more heat than can be removed from the interior of the sealed case by conduction cooling.

3. The apparatus of claim 1, further comprising a synthetic instrument, wherein the base computing unit, the test instrument board, and the interchangeable equipment interface pod provide a generic hardware system and in conjunction with a test bed integration software, the synthetic instrument can function as two or more of a volt/ohm meter, an oscilloscope, a signal generator, a trouble code reader, and a video display to perform a variety of test equipment functions without alteration to hardware of the testing apparatus.

4. The apparatus of claim 1, further comprising an antenna system for delivering wireless signals to the sealed case, the antenna system comprising:

a) a flat external collecting array disposed in a depression formed in a surface of the sealed case;

b) an antenna interface that projects from an interior surface of the external collecting array, said antenna interface comprising a pressure fitting connection; and c) a case antenna connector disposed inside the sealed case, the case antenna connector comprising a pressure fitting connection compatible with the antenna interface and providing a capacity for electrically connecting the case antenna connector with equipment disposed inside the sealed case, wherein an external surface of the external collecting array covers the antenna interface, forming a hermetic seal over the antenna interface while maintaining the integrity of the sealed case.

* * * * *